(12) United States Patent
Benelbar et al.

(10) Patent No.: US 7,368,980 B2
(45) Date of Patent: May 6, 2008

(54) PRODUCING REFERENCE VOLTAGES USING TRANSISTORS

(75) Inventors: Rebouh Benelbar, Murphy, TX (US); Walter Wohlmuth, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 11/114,642

(22) Filed: Apr. 25, 2005

(65) Prior Publication Data
US 2006/0238234 A1   Oct. 26, 2006

(51) Int. Cl.
*G05F 1/10* (2006.01)
(52) U.S. Cl. .................... 327/538; 327/546
(58) Field of Classification Search ............ None
See application file for complete search history.

(56) References Cited

U.S. PATENT DOCUMENTS

| | | | | |
|---|---|---|---|---|
| 4,100,437 | A * | 7/1978 | Hoff, Jr. ................. | 327/543 |
| 4,305,011 | A * | 12/1981 | Audaire et al. .......... | 327/566 |
| 4,654,578 | A * | 3/1987 | Salerno et al. .......... | 323/313 |
| 5,184,061 | A * | 2/1993 | Lee et al. ................ | 323/265 |
| 5,422,593 | A * | 6/1995 | Fujihira ................... | 327/561 |
| 5,448,084 | A * | 9/1995 | Hoke et al. ............. | 257/190 |
| 5,701,020 | A * | 12/1997 | Liu et al. ................ | 257/192 |
| 5,742,148 | A * | 4/1998 | Sudo et al. ............. | 320/134 |
| 5,838,192 | A | 11/1998 | Bowers et al. | |
| 5,973,550 | A * | 10/1999 | Bowers et al. ......... | 327/541 |
| 6,072,203 | A * | 6/2000 | Nozaki et al. .......... | 257/194 |
| 6,521,961 | B1 * | 2/2003 | Costa et al. ............ | 257/402 |
| 6,552,603 | B2 * | 4/2003 | Ueda ...................... | 327/541 |
| 6,787,826 | B1 | 9/2004 | Tserng et al. | |
| 2002/0177261 | A1 | 11/2002 | Song | |
| 2005/0110054 | A1 | 5/2005 | Wohlmuth | |

OTHER PUBLICATIONS

Chen et al., "New Approach to CMOS Current Reference with Very Low Temperature Coefficient," *GLVSI'03*, pp. 281-284 (2003).
"Field Effect Transistors in Theory and Practice," *Motorola Semiconductor Application Note*, AN211A, pp. 1-12 (1993).
Jung et al., "*References and Low Dropout Linear Regulators*" Chapter 2, pp. 2.1-2.57, within Kester, W., Editor, *Practical Design Techniques for Power and Thermal Management*, Analog Devices, Inc. (1998).
Miller et al., "Precision voltage references," *Analog Applications Journal*, pp. 1-4 (Nov. 1999).
Nasraty, "XFET™ References: Low noise, lower voltage than Zeners, Micropower, better than bandgaps," *Analog Dialogue*, vol. 32, No. 1, 5 pp. (1998).
"TQPED: 0.5 μm E/D pHEMT Foundry Service," TriQuint Semiconductor Advanced Information Process, pp. 1-2 (document marked Dec. 12, 2003).
"TriQuint Develops First Gallium Arsenide E-D pHEMT Foundry Process," downloaded from http://www.embeddedstar.com/press/content/2003/12/embedded12025.html, 2 pp. (document marked Dec. 16, 2003).

* cited by examiner

*Primary Examiner*—Cassandra Cox
(74) *Attorney, Agent, or Firm*—Klarquist Sparkman, LLP

(57) ABSTRACT

An exemplary circuit embodiment includes a depletion-mode transistor and an enhancement-mode transistor. The circuit also includes a circuit portion coupled to a gate region of the depletion-mode transistor and to a gate region of the enhancement-mode transistor. In this embodiment, the circuit portion is configured to provide a reference voltage at an output node, wherein the reference voltage is associated with a difference between a voltage at the gate region of the depletion-mode transistor and a voltage at the gate region of the enhancement-mode transistor.

23 Claims, 7 Drawing Sheets

PRODUCING REFERENCE VOLTAGES USING TRANSISTORS

This application is related to U.S. patent application Ser. No. 10/721,437 entitled "MONOLITHIC INTEGRATED ENHANCEMENT MODE AND DEPLETION MODE FIELD EFFECT TRANSISTORS AND METHOD OF MAKING THE SAME," the content of which is considered to be part of the present application and is hereby incorporated herein by reference.

TECHNICAL FIELD

This application relates to circuits for producing a reference voltage.

BACKGROUND

A wide variety of electronic devices includes components that operate using a reference voltage. For example, mobile phones and other wireless devices often comprise components, such as power amplifiers, that rely on a reference voltage for proper operation. Generally speaking, the reference voltage in a system should be as stable as possible, as fluctuations in the voltage can impact the overall performance of the system. Mobile devices pose a particular challenge in this regard because of the wide range of temperatures in which they operate. The reference voltage in such systems should also be relatively insensitive to variations in the supply voltage from which the reference voltage is derived.

Reference voltage circuits have traditionally used Zener diode, bipolar transistor, or junction field effect transistor (JFETs) designs. For example, U.S. Pat. Nos. 5,838,192 and 5,973,550 describe a reference voltage circuit that uses a pair of JFETs having different channel doping densities. JFETs are formed from a doped semiconductor material (for example, n-type silicon) that defines a channel situated between a source contact and a drain contact. An opposite dopant (for example, p-type doping of n-type silicon) is diffused into a side of the channel and forms a gate region. The interface between the two oppositely doped regions thus forms a p-n junction. As known in the art, a depletion region surrounding the p-n junction can be modulated by reverse-biasing the gate region. Thus, by varying the voltage applied to a gate contact attached to the gate region, the size of the depletion region and therefore the size of a conductive region in the channel can be controlled. Further, because the oppositely doped gate region is diffused into the channel during JFET formation, the p-n junction formed is a homojunction with no band gap difference.

In U.S. Pat. Nos. 5,838,192 and 5,973,550, one of the JFETs in the pair has an extra ion implantation in its channel, increasing the doping in the channel and raising the pinchoff voltage for that JFET. The reference voltage circuits described use the difference in gate-to-source voltages between the pair of JFETs to provide a reference voltage. The described circuits, however, are limited to JFET transistors, wherein one of the JFETs in the pair has an extra ion implantation. Further, the described pairs of JETS are of the same type—either both JFETs are depletion-mode type devices or both JETs are enhancement-mode type devices. Moreover, these reference voltage circuits are based on particular JFET constructions, and are not suited for integration into systems using other types of transistor technologies, such as high-speed devices with high electron mobility transistors (HEMTs). For example, the described reference voltage circuits are not well-suited for implementation on the same chip as an electronic component using HEMT transistors, such as, for example, pseudomorphic HEMTs.

DETAILED DESCRIPTION

Figure 1:
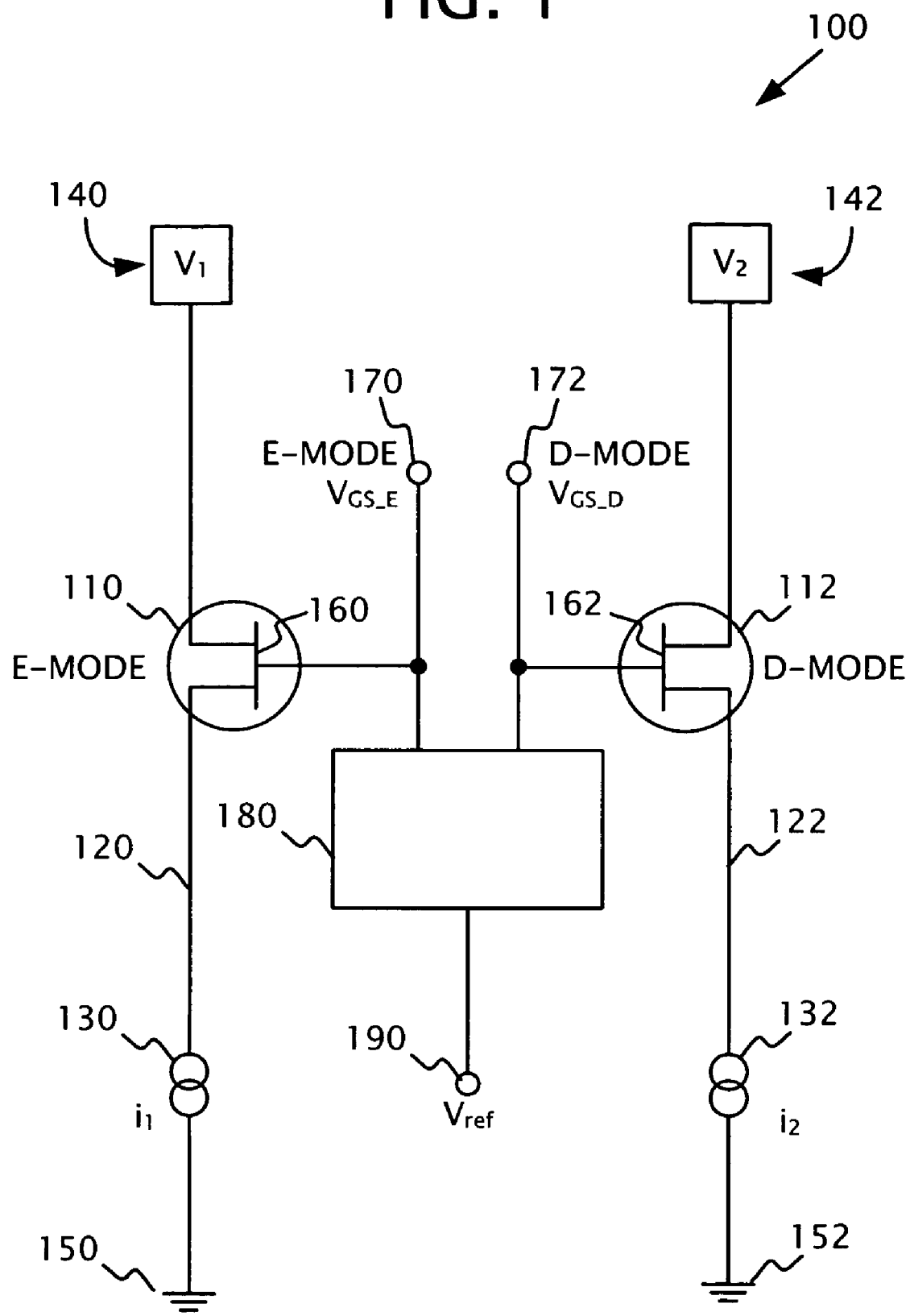
FIG. 1 is a schematic block diagram of a first exemplary embodiment of a circuit for producing a reference voltage.

As used in this application and in the claims, the singular forms "a," "an," and "the" include the plural forms unless the context clearly dictates otherwise. Additionally, the term "includes" means "comprises." Further, the term "coupled" means electrically or electromagnetically connected or linked and does not necessarily exclude the presence of intermediate elements between the coupled items.

Disclosed below are representative embodiments of a reference voltage circuit that may be used, for example, in electronic devices comprising one or more circuit components that operate using a reference voltage. Exemplary environments and applications for the disclosed embodiments are also disclosed. The described systems, methods, and apparatus should not be construed as limiting in any way. Instead, the present disclosure is directed toward all novel and nonobvious features, aspects, and equivalents of the various disclosed embodiments, alone and in various combinations and sub-combinations with one another. The disclosed systems, methods, and apparatus are not limited to any specific aspect, feature, or combination thereof, nor do the disclosed systems, methods, and apparatus require that any one or more specific advantages be present or problems be solved.

For the sake of simplicity, the attached figures may not show the various ways in which the disclosed systems, methods, and apparatus can be used in conjunction with other systems, methods, and apparatus. For example, although any of the disclosed embodiments can be implemented as part of an electronic device, other components of the device that are well known in the art are not described in further detail. For example, the disclosed embodiments may be used in a wireless handset to provide a reference voltage to a power amplifier in the handset. Such power amplifiers, however, are known in the art and will not be described in further detail.

The disclosed embodiments can be implemented in a wide variety of circuits and systems (for example, application-specific integrated circuits (ASICs), systems-on-a-chip (SOCs), systems in a package (SIPs), systems on a package (SOPs), multi-chip modules (MCMs), or other such devices). The various components of the disclosed embodiments can be implemented (separately or in various combinations and subcombinations with one another) using a variety of different semiconductor materials, including but not limited to: gallium arsenide (GaAs) and GaAs-based materials (AlGaAs, InGaAs, AlAs, InGaAlAs, InGaP, InGaNP, AlGaSb, and the like); indium phosphide (InP) and InP-based materials (InAlP, InGaP, InGaAs, InAlAs, InSb, InAs, and the like); silicon (Si), strained silicon, germanium (Ge) and silicon- and germanium-based materials (SiGe, SiGeC, SiC, $SiO_2$, high dielectric constant oxides, and the like) such as complementary metal-oxide-semiconductor (CMOS) processes; and gallium nitride materials (GaN, AlGaN, InGaN, InAlGaN, SiC, Sapphire, Si, and the like). In certain embodiments, for example, the reference voltage circuit (including the transistors and operational amplifier) is implemented on a single chip. The disclosed embodiments can also be implemented using combinations of these process technologies (for example, on multiple chips or on a single chip). The disclosed embodiments can also be implemented using a variety of different off-chip processes, including but not limited to low- or high-frequency printed circuit board (PCB) processes, thick- or thin-film hybrid processes, multi-layered organic processes, and low-temperature cofired ceramic (LTCC) processes.

Similarly, although many of the disclosed embodiments are described as being implemented using particular types of high electron mobility transistors (HEMTs), such as pseudomorphic HEMTS (pHEMTs), a variety of transistor technologies can be used to implement the disclosed embodiments. For example, the disclosed reference voltage embodiments can be implemented using other field effect transistor (FET) technologies (for example, metal-oxide-semiconductor FETs (MOSFETs), metal-semiconductor FETs (MESFETs), meta-morphic high-electron mobility transistors (mHEMTs), and heterojunction-insulated gate FETs (HIGFETs)). Combinations of these technologies or other transistor technologies can also be used to implement the disclosed circuit embodiments. Such combinations may be implemented on multiple chips or a single chip. For example, in one exemplary embodiment, a reference voltage circuit using pHEMTs is implemented on the same chip as one or more heterojunction bipolar transistors (HBTs).

The disclosed circuit embodiments and associated components can be included in a variety of electronic devices. For example, any of the disclosed embodiments can be included in mobile devices such as cell phones, personal digital assistants, mobile media players, laptop computers, and pagers to provide stable reference voltages. Devices based on wireless standards such as 802.11a, 802.11b, 802.11g, and BLUETOOTH may also include any of the reference voltage circuits. Other devices that use reference voltages, such as media distribution devices and desktop computers, can also include such reference voltage circuits. Further, any of the components in these devices that use a reference voltage can be implemented on the same chip as the reference voltage circuit. In a representative example, a mobile phone can comprise one or more power amplifiers that use the reference voltage generated by any of the disclosed circuit embodiments, and the reference voltage circuit can be implemented on the same chip as the one or more power amplifiers. Other applications for the disclosed embodiments include wireless systems (for example, WLAN or WiMax systems) and other such systems.

FIG. 1 is a schematic block diagram illustrating an exemplary reference voltage circuit 100 in accordance with the disclosed technology. Two transistors are shown in FIG. 1: an enhancement-mode transistor 110 (sometimes referred to herein as an "E-mode" transistor) and a depletion-mode transistor 112 (sometimes referred to herein as a "D-mode" transistor). An E-mode transistor is a transistor that substantially blocks the current flow through its channel when a gate-source voltage at a gate region of the transistor is zero. Once the gate-source voltage exceeds a certain threshold (the "threshold voltage"), however, substantial current is permitted to flow through the channel. For example, a typical E-mode transistor allows current flow when the gate-source voltage is above a positive threshold voltage. Depending on the polarity of the charge carrier in the channel, however, the E-mode transistor can have a negative threshold voltage and be configured to allow current flow when the gate-source voltage is below this negative threshold voltage. Because current flow is substantially blocked when the gate-source voltage is zero, E-mode transistors are sometimes called "normally-off" transistors. By contrast, a D-mode transistor is a transistor that allows channel current to flow when the gate-source voltage is zero (and assuming a potential difference between the source and drain regions of the transistor). Thus, D-mode transistors are sometimes called "normally-on" transistors. A typical D-mode transistor has a negative threshold voltage such that current flow is blocked when the gate-source voltage is below the negative threshold. When the gate-source voltage is above this negative threshold (including at or above zero), however, substantial current will be allowed to flow through the D-mode transistor channel. Depending on the polarity of the charge carrier in the channel, however, the D-mode transistor may have a positive threshold voltage and be configured to allow current flow when the gate-source voltage is below this positive threshold voltage. D-mode and E-mode transistors typically have different threshold voltages, and likewise have different pinch-off voltages.

In FIG. 1, the channel between a source and drain of the E-mode transistor 110 forms part of a first current path 120, which is driven by a first voltage source 140 and terminates at a ground 150. In the illustrated embodiment, the first current path 110 carries a current $i_1$ determined by a first current source 130, such as, for example, a transistor configured to maintain a constant current. Similarly, the D-mode transistor 112 forms part of a second current path 122 driven by a second voltage source 142 and terminates at a ground 152. The second current path 122 carries a current $i_2$ determined by a second current source 132.

Figure 3:
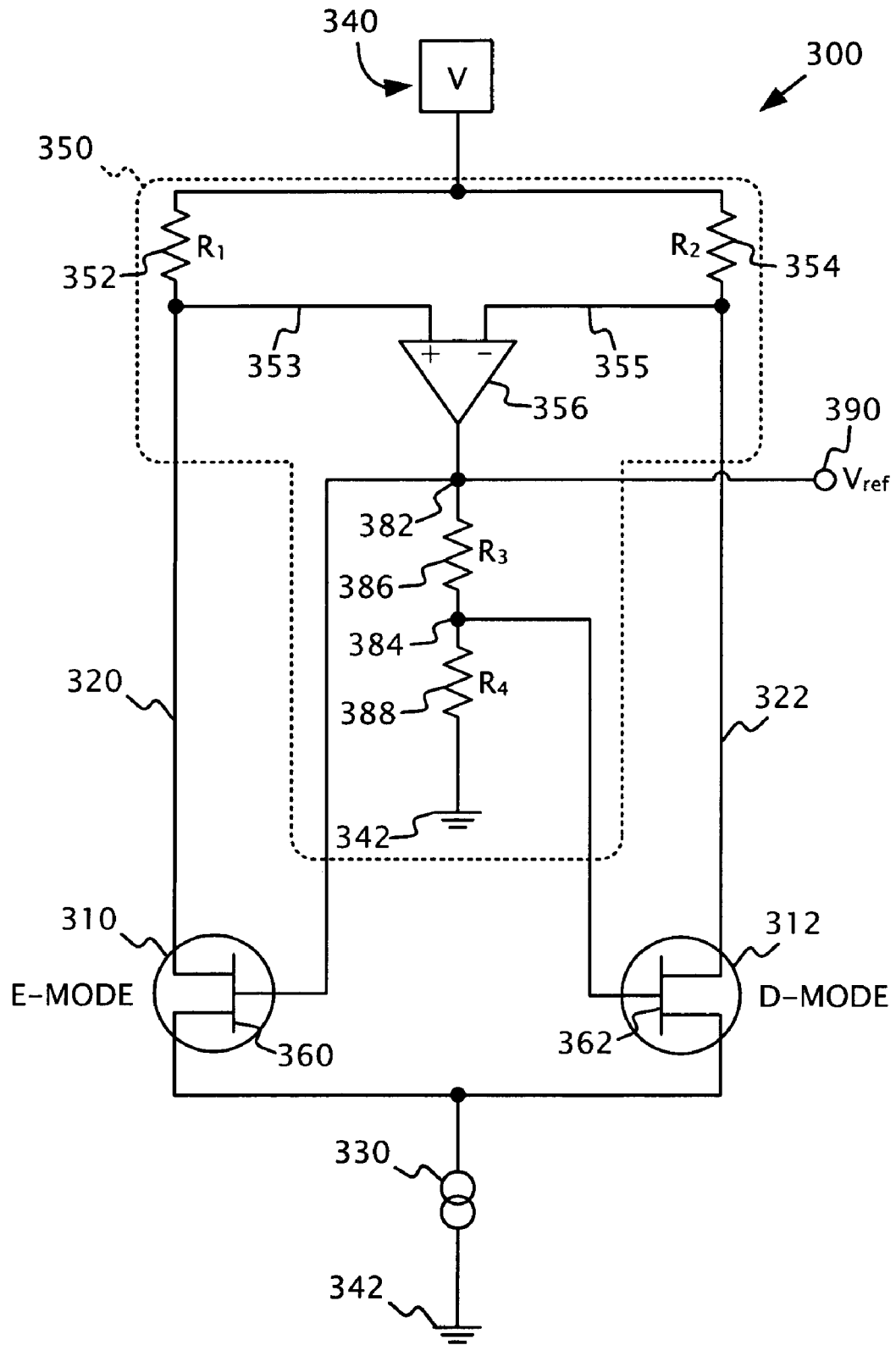
FIG. 3 is a schematic block diagram of a second exemplary embodiment of a circuit for producing a reference voltage.
Figure 4:
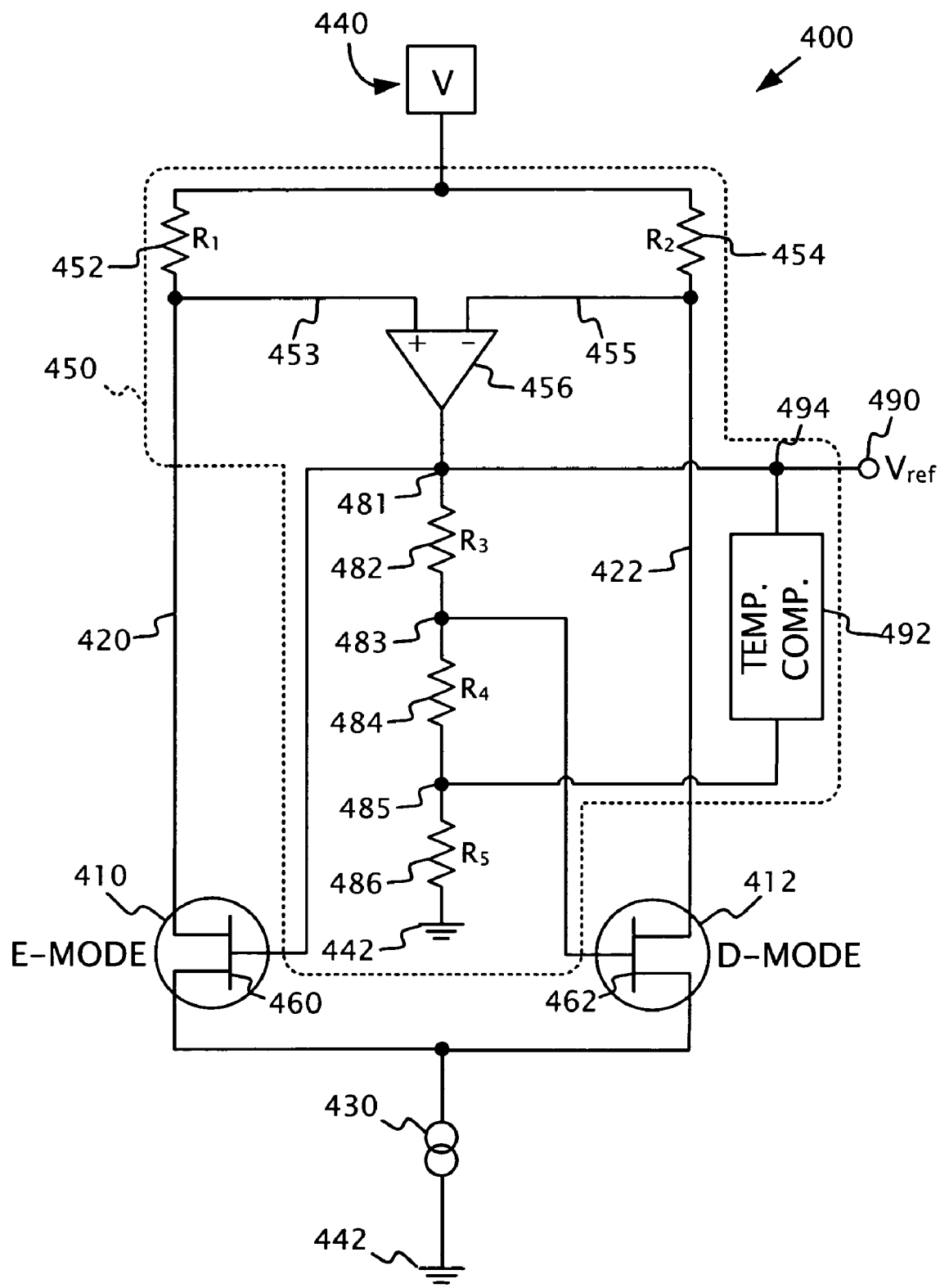
FIG. 4 is a schematic block diagram of a third exemplary embodiment of a circuit for producing a reference voltage that includes a temperature compensation circuit portion.
Figure 5:
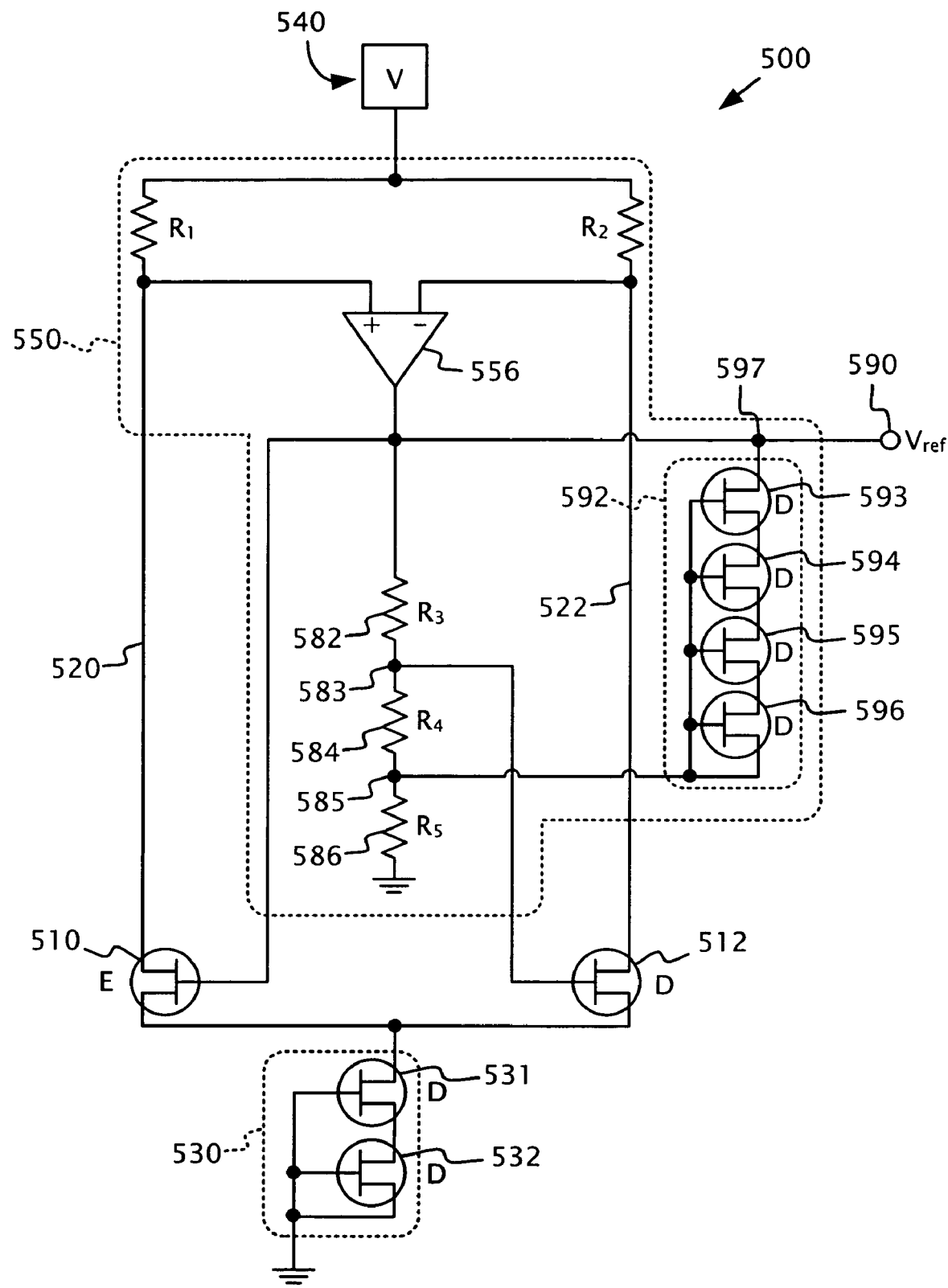
FIG. 5 is a schematic block diagram of a fourth exemplary embodiment of a circuit for producing a reference voltage that also includes a temperature compensation circuit.

In certain embodiments, the voltages $V_1$ and $V_2$ at sources 140, 142, respectively, are substantially equal and the current sources 130, 132 are controlled to produce substantially equal currents in the current paths 120, 122. For example, and as illustrated in FIGS. 3-5, the voltage sources 140, 142 can comprise a single voltage source (for example, a battery) and the current sources 130, 132 can be a single current source. In other embodiments, however, the current sources 130, 132 can be controlled to produce currents in the current paths 120, 122 having a substantially fixed relationship to one another (for example, substantially equal currents). In still other embodiments, the currents in the paths 120, 122 are not substantially equal. Further, depending on the implementation, the voltages $V_1$, $V_2$ can be positive or negative. For example, the voltages may be negative when p-channel transistors are used.

The E-mode transistor 110 and the D-mode transistor 112 further comprise respective source regions, drain regions, and gate regions. The currents through the source and drain regions of the transistors 110, 112 can be controlled by respective voltage differences between the gate and source regions of the transistors. Such a voltage difference is commonly referred to as the gate-source voltage ($V_{gs}$). In FIG. 1, the gate-source voltage of the E-mode transistor 110 ($V_{gs\_E}$) is controlled by the voltage at an E-mode gate-source voltage node 170. Similarly, the gate-source voltage of the D-mode transistor 112 ($V_{gs\_D}$) is controlled by the voltage at a D-mode gate-source voltage node 172. The voltages at the nodes 170, 172 can be independent of one another (for example, supplied from different voltage sources) or dependent on one another (for example, supplied from a common voltage source and a voltage divider) depending on the implementation. For example, in some embodiments, the nodes 170, 172 can have voltages established by a circuit portion that regulates the respective gate-source voltages applied at the nodes 170, 172 in response to changes in the current through the paths 120, 122. In one particular implementation, for example, the nodes 170, 172 can be controlled by a circuit portion configured to maintain the currents through the respective transistors 110, 112 in a substantially fixed relationship (for example, so that the currents are substantially equal) using a closed loop approach.

Also shown in FIG. 1 is a circuit portion 180 configured to produce a reference voltage ($V_{ref}$) at an output node 190. In some embodiments, the reference voltage ($V_{ref}$) is a function of the difference between the E-mode and the D-mode gate-source voltages ($V_{gs\_E} - V_{gs\_D}$), respectively. For purposes of this discussion, this voltage difference is sometimes referred to as the gate-source-voltage difference ($\Delta V_{gs}$).

The circuit portion 180, for example, may be configured to produce a desired reference voltage ($V_{ref}$) when the gate-source voltage difference ($\Delta V_{gs}$) is substantially equal to a certain value. For example, and according to one exemplary embodiment, the circuit portion 180 can be configured to produce the desired reference voltage when the gate-source voltage difference is substantially equal to the difference between the threshold voltages of the transistors or the difference between the pinch-off voltages of the transistors 110, 112. In certain embodiments, the circuit portion 180 comprises a combination of serially connected resistors (for example, a voltage divider) configured to produce the desired reference voltage as a function of the gate-source voltage difference. The composition of the circuit portion 180 may vary, however, depending on the implementation.

Similarly, the E-mode and D-mode transistors 110, 112 shown in FIG. 1 (and in any of the disclosed embodiments) can be implemented according to a variety of transistor technologies. In one exemplary embodiment, the transistors 110, 112 comprise high electron mobility transistors (HEMTs). In one particular implementation, the transistors 110, 112 comprise pseudomorphic HEMTs.

Generally speaking, a HEMT is a type of field effect transistor wherein conduction occurs in a channel formed between two materials with different band gaps. For this reason, HEMTs are also known as heterojunction FETs (HFETs). A typical HEMT includes a channel layer overlaid by a spacer layer overlaid by a barrier layer. The spacer and barrier layers are typically formed of a wide band gap semiconductor material, whereas the channel layer is formed of a narrow band gap semiconductor material (typically having little or no doping). The conduction band discontinuity at the junction between the two (referred to as the "heterojunction") enables electrons to be injected from the barrier layer into the channel layer. The injected electrons form a thin channel wherein there exists little scattering caused by doping impurities. Consequently, this conductive channel has very low resistance and operates with a very low noise figure, making HEMTs better suited for high speed applications than traditional FET technologies, such as JFETs.

Further, there are two basic types of HEMTs: regular HEMTS and psuedomorphic HEMTs (pHEMTs). In a regular HEMT, the one or more layers of materials used to form the heterojunction have the same lattice constants. In a pHEMT, however, one or more layers incorporated into the device have lattice constants that differ (sometimes significantly). This lattice mismatch allows materials of varying band gaps to be used in the device. Thus, the heterojunction of a pHEMT can be fabricated to have a large band gap difference. Consequently, the pHEMT can operate at higher frequencies and with better noise properties than a regular HEMT.

Conduction within the channel of a HEMT is typically controlled by a voltage applied to a gate contact that overlays or is otherwise in contact with the barrier layer. For example, the gate-source voltage applied to the gate can modulate the number of electrons transferred from the barrier layer into the channel layer at the heterojunction. The thickness of the barrier layer overlaying the channel layer can also affect the operation the HEMT. In general, the threshold voltage of a HEMT depends on the thickness of the barrier layer. Typically, as the thickness of the barrier layer decreases, the threshold voltage generally increases; correspondingly, as the thickness of the barrier layer increases, the threshold voltage decreases. For HEMTs with relatively thin barrier layers, the threshold voltage can be positive, and thus such HEMTs comprise E-mode HEMTs. Similarly, for HEMTs with relatively thick barrier layers, the threshold voltage can be negative, and thus such HEMTs comprise D-mode HEMTs.

In certain embodiments of the representative circuit illustrated in FIG. 1, the E-mode transistor 110 comprises an E-mode pHEMT, and the D-mode transistor 112 comprises a D-mode pHEMT. Further, in particular implementations of these embodiments, the E-mode pHEMT and D-mode pHEMT are monolithically integrated on a single substrate. For example, the E-mode and D-mode pHEMTs can be formed using the TQPED process available from TriQuint Semiconductor, Inc.

Figure 2:
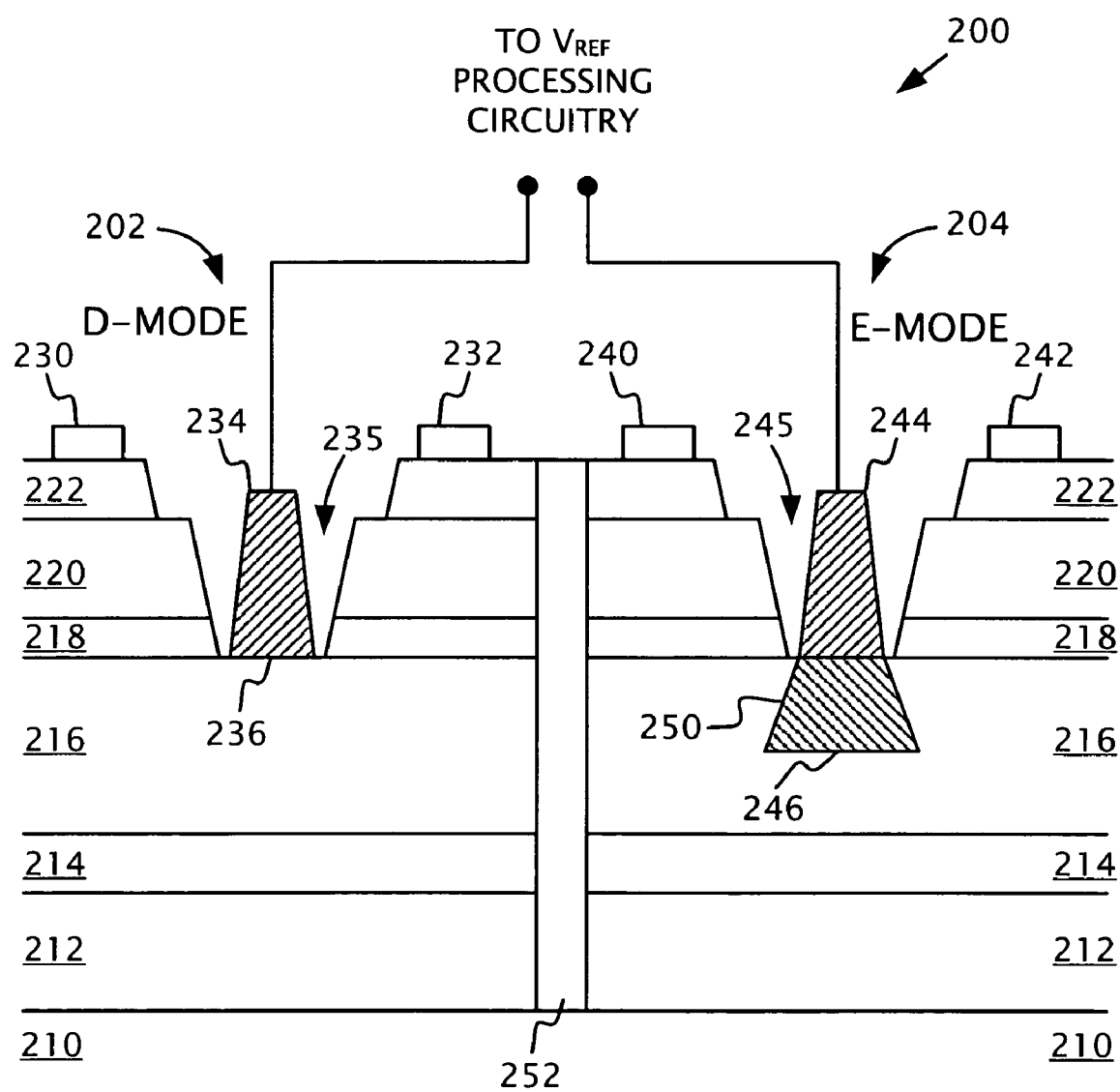
FIG. 2 is a cross-sectional schematic block diagram illustrating the structure of exemplary enhancement-mode and depletion-mode pseudomorphic high electron mobility transistors (pHEMTs) as may be used in any of the disclosed embodiments.

FIG. 2 is a cross-sectional schematic block diagram illustrating exemplary monolithically integrated E-mode and D-mode pHEMTs as may be used in the circuit of FIG. 1 (or in any of the circuit embodiments described herein). The exemplary multi-layer structure 200 of FIG. 2 is formed on a semiconductor substrate 210 (for example, of semi-insulating GaAs). The successive layers overlaying the substrate 210 comprise: a buffer layer 212, channel and spacer layers 214, a barrier layer 216, an etch stop layer 218, a wide recess transition layer 220, and an ohmic contact layer 222. The D-mode pHEMT 202 further comprises a metal source contact 230, a metal drain contact 232, and a gate contact 234. The E-mode pHEMT 204 also comprises a metal source contact 240, a metal drain contact 242, and a gate contact 244. The transistors 202, 204 can be electrically isolated from one another in the resulting monolithic structure. For example, the transistors 202, 204 can be implemented within a region of implanted ions with a region 252 that extends from the ohmic contact layer 222 through the buffer layer 212.

In a particular embodiment, the semiconductor substrate 210 is composed of semi-insulating GaAs. The buffer layer 212 overlaying the substrate 210 is composed of an initial bulk GaAs material layer followed by an optional superlattice of alternating GaAs and $Al_{(x)}Ga_{(1-x)}As$ ($0.0 \leq x \leq 0.5$) material layers. In this embodiment, the channel layer 214 is formed of $In_{(y)}Ga_{(1-y)}As$ ($0.1 \leq y \leq 0.5$). The channel layer 214 is typically unintentionally doped, has a uniform composition, and is formed of a narrow band gap semiconductor material. A spacer layer (not expressly shown) is typically disposed on either side of the channel layer and can be composed of $Al_{(x)}Ga_{(1-x)}As$ ($0.0 \leq x \leq 0.5$). The spacer layers are typically unintentionally doped. In other embodiments, an $In_{(z)}Ga_{(1-z)}P$ ($0.4 \leq z \leq 0.6$) material is used for the spacer layers. The spacer layers are usually composed of materials that produce a large band offset relative to the $In_{(y)}Ga_{(1-y)}As$ channel layer 214. This offset aids in the confinement of charge that is transferred into the channel layer 214. In some embodiments, silicon dopant layers are grown on one or both sides of the channel layer 214 at the spacer layer interface opposite to the channel-spacer layer interface.

In the exemplary embodiment, the barrier layer 216 is composed of a wide band gap semiconductor material. For instance, in a particular implementation, the barrier layer 216 is composed of $Al_{(x)}Ga_{(1-x)}As$ ($0.0 \leq x \leq 0.8$), which can be unintentionally doped or doped. Further, a thin layer of GaAs can be incorporated on top of the $Al_{(x)}Ga_{(1-x)}As$ layer to prevent surface oxidation of the high-aluminum-content $Al_{(x)}Ga_{(1-x)}As$. In other implementations, an $In_{(z)}Ga_{(1-z)}P$ ($0.4 \leq z \leq 0.6$) material is used for the barrier layer 216.

The etch stop layer 218 can be formed of unintentionally doped or doped $In_{(z)}Ga_{(1-z)}P$. In embodiments where the barrier layer 216 is an $In_{(z)}Ga_{(1-z)}P$ layer, the etch stop layer 218 may be an $Al_{(x)}Ga_{(1-x)}As$ ($0.0 \leq x \leq 0.8$) layer. The wide recess transition layer 220 can be formed of $Al_{(x)}Ga_{(1-x)}As$ ($0.0 \leq x \leq 0.8$), and the ohmic contact layer 222 can be formed of an $In_{(y)}Ga_{(1-y)}As$ ($0.0 \leq y \leq 1$) layer. The doping level in the ohmic contact layer 222 typically is typically as high as possible and is limited by the solid solubility of the dopant in this layer. The gate contact 234 of the D-mode pHEMT 202 and/or the gate contact 244 of the E-mode pHEMT 204 can be placed either on the unremoved etch stop layer 218 or on the barrier layer 216 after the removal of the etch stop layer 218.

In the embodiment illustrated in FIG. 2, metal source contacts 230, 240 and metal drain contacts 232, 242 are respectively formed on the top surfaces of the ohmic contact layer 222 of the D-mode transistor 202 and the E-mode transistor 204. The respective source and drain contacts 230, 232, 240, 242 can be formed by depositing several successive metal layers (for example, Au—Ni—Ge—Au) on the ohmic contact layer 222, followed by a high temperature annealing process that causes the metal layers to intermix with the semiconductor material of the ohmic contact layer.

In the illustrated embodiment, the D-mode gate contact 234 is formed on the upper surface of the barrier layer 216 at the bottom of a D-mode gate recess 235. In this embodiment, the D-mode gate contact 234 is formed of a combination of other electrically conductive materials (for example, Ti, W, WSi, Au, Pt, Pd, Mo, Ir, Ta, TaN, Al). One exemplary D-mode gate contact is formed of successive layers of Ti—Pt—Au.

The E-mode gate contact 244 is also formed of metal layers deposited on the upper surface of the barrier layer 216 at the bottom of an E-mode gate recess 245. However, in the illustrated embodiment, the E-mode gate contact 244 differs from that of the D-mode gate contact 234 in that it is constructed such that the initial metal layer placed on the upper surface of the barrier layer 216 diffuses into the semiconductor material of the barrier layer 216 in a controllable and uniform manner, thereby forming an amorphized region 250. As the material of this initial metal layer diffuses into the barrier layer 216, a solid state interaction occurs to form small-grain-sized, uniformly stratified, electrically conductive elemental compound layers that create a Schottky contact with the semiconductor material of the barrier layer 216. Thus, a separation between the channel layer 214 and a control surface 246 associated with the gate contact 244 of the E-mode transistor 204 is different than a separation between the channel layer 214 and a control surface 236 associated with the gate contact 234 of the D-mode transistor 202.

In general, the control of the depth of the amorphized material in the amorphized region 250 is dependent on the type and thickness of the first-deposited metallic layer and the process parameters used to initiate, drive, and complete the reactions. The presence of the amorphized region 250 beneath the E-mode gate contact 244 can effectively change the thickness of the barrier layer 216 by altering the separation between the control surface 246 and the channel layer 214. Consequently, the threshold voltage of the transistor 204 can be adjusted so that no current flows from the source contact 240 to the drain contact 242 in the absence of a gate-source voltage applied to the gate contact 244. In this way, the transistor 204 can be formed to operate as an E-mode transistor.

In the illustrated embodiment, for example, the initial metal layer deposited is selected from a group of metals (for example, Ir, Pd, Pt, Ni, Co, Cr, Ru, Os, Ro, and Re, and combinations thereof) that will amorphize with the semiconductor material of barrier layer 216 under selected process conditions, thereby forming the amorphized region 250. One or more additional layers of electrically conductive material are subsequently deposited (for example, W, WSi, Ti, Au, Pt, Pd, Mo, Ir, Ta, TaN, Al, and combinations thereof). The amorphization of the initial metal layer involves the use of a controlled thermal treatment (for example, in the 250 to 400° C. range). This thermal treatment may occur during a dedicated heating step or during one of the final fabrication stages when the blanket dielectric layer is deposited over the multilayer structure 200 (for example, using a PECVD process). One particular E-mode gate contact as may be used in the E-mode transistor 204 is formed of successive layers of Pt—Ti—Pt—Au. Desirably, the amorphization of the initial platinum layer into the barrier 216 produces uniform, stratified layers of electrically conductive compounds with small grain size and very little intermixing of the stratified layers.

The particular monolithic structure shown in FIG. 2 should not be construed as limiting in any way, as similar and equivalent structures can be formed in accordance with the described principles. For example, in certain alternative embodiments, the D-mode gate contact 234 is deposited on the surface of the transition layer 220 and may itself comprise an amorphized region as described above. Or, the D-mode and E-mode gate contacts 234, 244 can both be deposited on the surface of the etch stop layer 218. Further, in some embodiments, an ion implant region (for example, opposite of the doping in the barrier layer 216) can be formed into the barrier layer prior to formation of the E-mode gate contact 244. Still further, some embodiments of the structure 200 exclude the buffer layer 212 altogether. These and other features and aspects of exemplary monolithic E-mode and D-mode transistors are described in greater detail in U.S. patent application Ser. No. 10/721,437, the content of which is considered to be part of the present application and is hereby incorporated herein by reference.

FIG. 3 is a schematic block diagram showing a second, more specific, embodiment of a reference voltage circuit 300 according to some of the principles introduced above with respect to FIG. 1. The circuit 300 comprises an E-mode transistor 310 in an E-mode current path 320 and a D-mode transistor 312 in a D-mode current path 322. The E-mode and D-mode transistors 310, 312 can comprise any suitable E-mode and D-mode transistors, such as any of the pHEMT transistor embodiments described above with reference to FIG. 2. In one particular embodiment, the circuit 300 and the transistors 310, 312 are formed on a single substrate (for example, using the TQPED process). In FIG. 3, the current paths 320, 322 are parallel current paths coupled to a single voltage source 340 and a single current source 330. The portions of the current paths 320, 322 coupled to the drain regions of the transistors 310, 312 further include resistive elements 352, 354, which have respective resistances $R_1$ and $R_2$. The resistive elements 352, 354 can comprise one or more resistors and, in one exemplary embodiment, provide substantially equal resistances. In other embodiments, however, the resistive elements provide different resistances. Further, as illustrated in FIG. 3, one side of the resistive elements 352 ($R_1$) and 354 ($R_2$) can be coupled to respective inputs of an operational amplifier 356 via input paths 353, 355. For example, the E-mode current path 320 can be coupled to the noninverting input (+) of the operational amplifier 356, whereas the D-mode current path 322 can be coupled to the inverting input (−) of the amplifier. An output of the operational amplifier 356 is used to provide and maintain the stability of the reference voltage at an output node 390. In the illustrated embodiment, for example, the output of the operational amplifier 356 is coupled at a junction 382 to a gate region 360 of the E-mode transistor 310, to the output node 390, and to a gate region 362 of the D-mode transistor 312 through a resistive element 386 (with a resistance $R_3$). The operational amplifier 356 and the resistive element 386 ($R_3$) form part of a circuit portion 350 that is configured to produce the reference voltage from the gate-source voltages of the respective transistors 310, 312. In particular, the resistive element 386 ($R_3$) and a resistive element 388 ($R_4$) form a series combination of resistive elements coupled at one end to the junction 382 and at another end to a ground 342. Further, the gate region 362 of the D-mode transistor 312 is coupled to a junction 384 between the resistive elements 386 ($R_3$) and 388 ($R_4$).

In one exemplary implementation of the embodiment illustrated in FIG. 3, the resistances $R_1$ and $R_2$ provided by the resistive elements 352 and 354, respectively, are substantially equal. Thus, during operation, the operational amplifier 356 tends to establish and maintain voltages at the gate regions 360, 362 so that the currents through the transistors 310, 312 are substantially equal. In this implementation, the operational amplifier 356 tends to amplify any voltage difference that exists on the input paths 353, 355 so that the gate-source voltages of the transistors 310, 312 are forced to voltages that produce substantially equal currents through the transistors 310, 312. By doing so, the operational amplifier 356 tends to stabilize and continuously maintain a substantially constant gate-source voltage difference ($\Delta V_{gs}$) between the transistors 310, 312.

In the exemplary embodiment illustrated in FIG. 3, the reference voltage ($V_{ref}$) at output node 390 can be estimated by considering a current through the resistive element 386 ($R_3$), which is also the current from junction 382 to ground 342. Applying Ohm's law:

$$i = \frac{V_{gs\_E} - V_{gs\_D}}{R_3} \quad (1)$$
$$= \frac{\Delta V_{gs}}{R_3},$$

wherein i is a current from junction 382 to ground 342, $V_{gs\_E}$ is a gate-source voltage of the E-mode transistor 310, $V_{gs\_D}$ is a gate-source voltage of the D-mode transistor 312, $\Delta V_{gs}$ is the gate-source voltage difference, and $R_3$ is the resistance of the resistive element 386. Applying Ohm's law again to the series of resistive elements 386 ($R_3$) and 388 ($R_4$) in order to determine the reference voltage gives:

$$V_{ref} = i(R_3 + R_4) \quad (2)$$
$$= \frac{\Delta V_{gs}}{R_3}(R_3 + R_4)$$
$$= \Delta V_{gs}\left(1 + \frac{R_4}{R_3}\right)$$

Thus, the reference voltage ($V_{ref}$) can be said to be a function of or based on the gate-source voltage difference.

The particular manner in which the reference voltage is generated by the circuit portion 350 in FIG. 3 (or in the circuit embodiments discussed below) should not be construed as limiting in any way, as other configurations are possible without departing from the principles of the disclosed technology. For example, the output node 390 could be coupled to the junction 384 instead of the junction 382. Further, the path connecting the output node 390 to the series of resistive elements could itself include one or more buffers to isolate the circuit portion 350 from the load.

FIG. 4 is a schematic block diagram showing an embodiment of a reference voltage circuit 400 that further includes a temperature compensation circuit. The circuit 400 comprises an E-mode transistor 410 in an E-mode current path 420 and a D-mode transistor 412 in a D-mode current path 422. The E-mode and D-mode transistors can comprise any suitable E-mode and D-mode transistors, such as any of the pHEMT transistor embodiments described above with reference to FIG. 2. For example, in one particular embodiment, the circuit 400 and the transistors 410, 412 are formed on a single substrate (for example, using the TQPED process).

In FIG. 4, the current paths 420, 422 comprise parallel current paths coupled to a single voltage source 440 (for example, a battery) and a single current source 430. In FIG. 4, the current paths 420, 422 further include resistive elements 452, 454 having respective resistances of $R_1$ and $R_2$. In the illustrated embodiment, the current paths 420, 422 further provide voltages to the inputs of an operational amplifier 456 along input paths 453, 455. As more fully discussed above, the operational amplifier 456 has an output voltage used to establish and maintain the stability of the reference voltage provided at an output node 490. For example, in one particular nonlimiting implementation of the circuit 400, resistive elements 452, 454 create substantially equal resistances ($R_1=R_2$), and the operational amplifier 456 works to set the gate-source voltages of transistors 410, 412 so that the current flowing through the current paths 420, 422 is substantially equal. In this particular implementation, the gate-source voltage difference remains stable for a constant current being drawn by the current source 430.

Changes in temperature, however, can be associated with changes in the reference voltage ($V_{ref}$). For example, temperature changes may affect the current being drawn by the current source 430, and thus alter the gate-source voltages applied to the transistors 410, 412 and the value of the reference voltage ($V_{ref}$). To compensate for current changes in the current paths 420, 422 (and thus for voltage changes on the input paths 453, 455), the circuit 400 of FIG. 4 further includes a temperature compensation circuit 492. The temperature compensation circuit 492 can comprise, for example, a current source (for example, one or more transistors or other suitable electrical component).

In FIG. 4, the temperature compensation circuit 492 forms part of circuit portion 450, which is configured to provide and stabilize the reference voltage. In the illustrated embodiment, for example, the output of the operational amplifier 456 is coupled at a junction 481 to a gate region 460 of the E-mode transistor 410, to the output node 490, and to a series combination of resistive elements 482, 484, 486 that terminate at a ground 442. The resistive elements 482, 484, 486 have respective resistances of $R_3$, $R_4$, and $R_5$. A gate region 462 of the D-mode transistor 412 is coupled to the series of resistive elements at a junction 483 between resistive elements 482 ($R_3$) and 484 ($R_4$). A first end of the temperature compensation circuit 492 is coupled to the series at a junction 485 between resistive elements 484 ($R_4$) and 486 ($R_5$). A second end of the temperature compensation circuit 492 is coupled at a junction 494 to the junction 481 and to the output node 490.

In the exemplary embodiment shown in FIG. 4, the reference voltage ($V_{ref}$) at output node 490 can be found in a manner similar to that described above. Neglecting the D-mode gate current, the current through the resistive elements 482 ($R_3$) and 484 ($R_4$) can again be found by considering the current through the resistive element 482 ($R_3$). Thus, $$i_{R_3R_4} = \frac{V_{gs\_E} - V_{gs\_D}}{R_3} \quad (3)$$
$$= \frac{\Delta V_{gs}}{R_3},$$

where $i_{R_3R_4}$ is the current through the series of resistive elements 482 ($R_3$) and 484 ($R_4$), $V_{gs\_E}$ is the gate-source voltage of the E-mode transistor 410, $V_{gs\_D}$ is the gate-source voltage of the D-mode transistor 412, $\Delta V_{gs}$ is the gate-source voltage difference, and $R_3$ is the resistance of the resistive element 482.

Solving for the reference voltage ($V_{ref}$) at the node 490 and taking into account the temperature compensation circuit 492 gives:

$$V_{ref} = i_{R_3R_4}(R_3 + R_4 + R_5) + i_{comp}R_5 \quad (4)$$
$$= \frac{\Delta V_{gs}}{R_3}(R_3 + R_4 + R_5) + i_{comp}R_5$$
$$= \Delta V_{gs}\left(1 + \frac{R_4 + R_5}{R_3}\right) + i_{comp}R_5$$

where $i_{R_3R_4}$ is the current through the resistive elements 482 ($R_3$) and 484 ($R_4$), $i_{comp}$ is the current through the temperature compensation circuit 492, $\Delta V_{gs}$ is the gate-source voltage difference, and $R_3$, $R_4$, and $R_5$ are the respective resistances of the resistive elements 482, 484, 486.

In operation, for example, the current source 430 may tend to increase current as temperatures decrease. Consequently, and according to one nonlimiting implementation of the exemplary circuit 400, the gate-source voltages applied to the E-mode and D-mode transistors 410, 412, would be increased. In the absence of the temperature compensation circuit 492, the increased gate-source voltages will also increase the reference voltage ($V_{ref}$) seen at the output node 490 and create a greater current through the series of resistive elements 482 ($R_3$), 484 ($R_4$), 486 ($R_5$). However, the temperature compensation circuit 492 can comprise a current source (for example one or more transistors) that also draws more current with decreasing temperature. The increased current through the temperature compensation circuit 492 will create a corresponding decrease in the current through resistive elements 482 ($R_3$) and 484 ($R_4$), which in one specific embodiment will substantially exactly offset the effect of the increased gate-source voltages. Thus, the reference voltage provided at the output node 490 will remain substantially constant.

FIG. 5 is a schematic block diagram of a more specific reference voltage circuit 500. The circuit 500 comprises an E-mode transistor 510 in an E-mode current path 520 and a D-mode transistor 512 in a D-mode current path 522. The E-mode and D-mode transistors can comprise any suitable E-mode and D-mode transistor, such as any of the pHEMT transistor embodiments described above with reference to FIG. 2. For example, in one particular embodiment, the circuit 500 and the transistors 510, 512 are formed on a single substrate (for example, using the TQPED process). In FIG. 5, the current paths 520, 522 comprise parallel current paths coupled to a single voltage source 540 (for example, a battery) and a single current source 530. In the illustrated embodiment, the single current source 530 comprises two D-mode transistors 531, 532. Although two D-mode transistors are shown, the current source 530 can be formed from other numbers of transistors (for example, one) and may alternatively comprise E-mode transistors or combinations of E-mode and D-mode transistors. Further, the transistors 531, 532 can comprise any suitable type of transistor. In one particular implementation, for example, the D-mode transistors comprise D-mode pHEMT transistors.

In FIG. 5, the current through the current paths 520, 522 is regulated by a circuit portion 550, which comprises an operational amplifier 556 and operates in the manner described above with respect to the circuit embodiments shown in FIGS. 3 and 4. FIG. 5 also shows that the circuit portion 550 provide the reference voltage ($V_{ref}$) at the output node 590. For example, the circuit portion 550 comprises a series of resistive elements 582 ($R_3$), 584 ($R_4$), 586 ($R_5$) with junctions 583, 585 respectively coupled to a gate region of the D-mode transistor 512 and to a temperature compensation circuit 592. In the illustrated embodiment, the temperature compensation circuit 592 comprises four serially connected D-mode transistors 593, 594, 595, 596. A drain region of the first transistor 593 in the series is coupled to a junction 597, while a source region of the last transistor 596 in the series is coupled to the junction 585. The gates of the transistors 593, 594, 595, 596 are also coupled to the junction 585.

Although four D-mode transistors are shown, the temperature compensation circuit 592 can be formed from other numbers of transistors (for example, one) and may alternatively comprise E-mode transistors or combinations of E-mode and D-mode transistors. Further, the transistors 593, 594, 595, 596 can comprise any suitable type of transistor. In one particular implementation, for example, the D-mode transistors 593, 594, 595, 596 comprise D-mode pHEMT transistors (such as the pHEMT transistors described above with respect to FIG. 2). Further, the transistors can be formed on a single substrate with the other components of the circuit 500.

Figure 6:
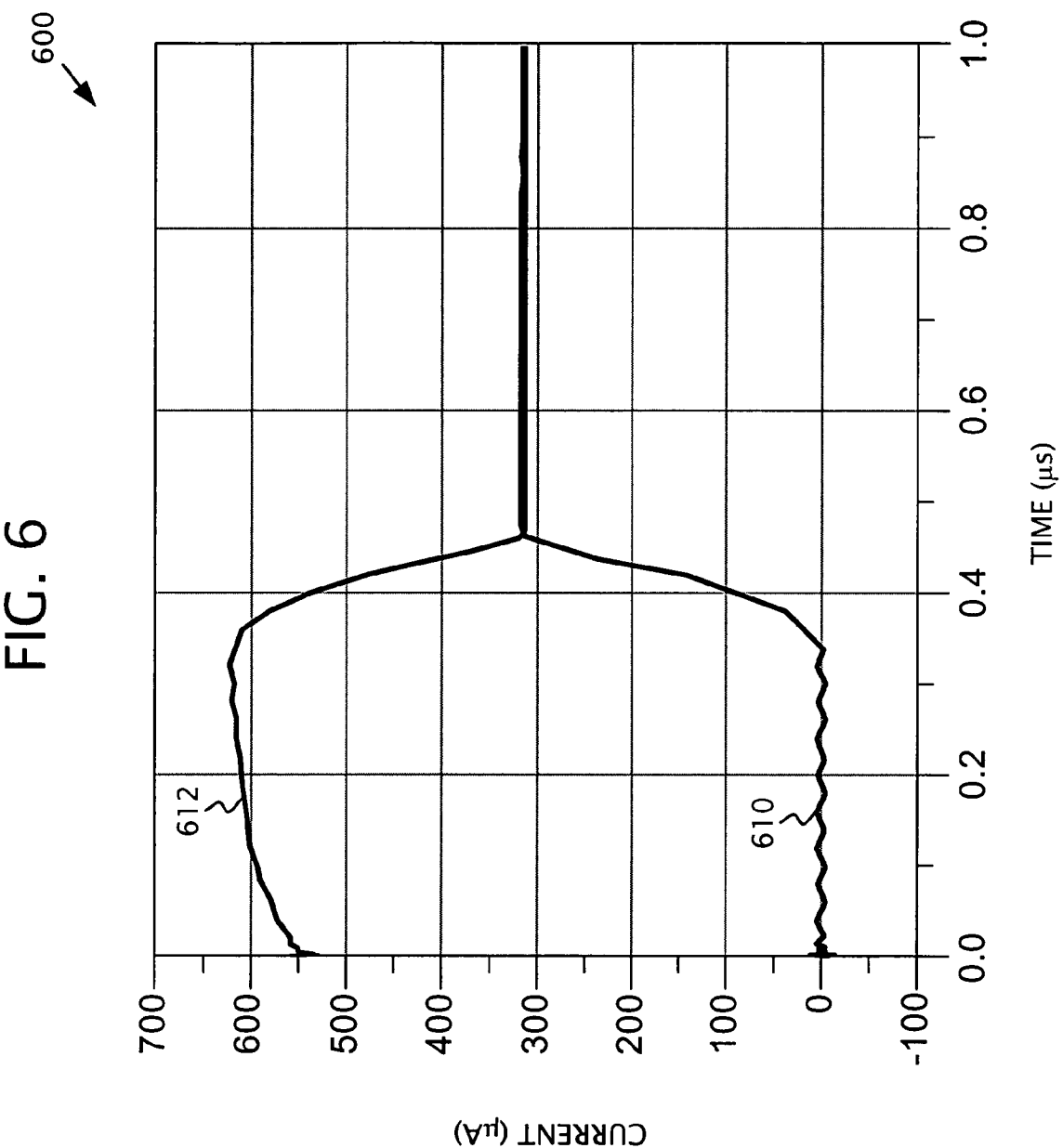
FIG. 6 is a graph illustrating how currents through the enhancement-mode and depletion-mode transistors of the circuit embodiment illustrated in FIG. 5 are stabilized during operation of the exemplary circuit embodiment.

Numerous simulations were performed using the circuit embodiment shown in FIG. 5 wherein the various E-mode and D-mode transistors were modeled to behave as pHEMT transistors formed with the TQPED process. Further, for purposes of the simulations, the resistances values $R_1$ and $R_2$ were equal. FIG. 6 is a graph 600 showing a first set of simulation results for the circuit 500. In particular, graph 600 shows a plot 610 of the current through the E-mode transistor 510 as the circuit 500 is activated. Likewise, graph 600 shows a plot 612 of the current through the D-mode transistor 512 during the same time period. As can be seen from the graph 600, the circuit 500 works to apply the proper gate voltages to produce substantially equal currents through the transistors 510, 512.

Figure 7:
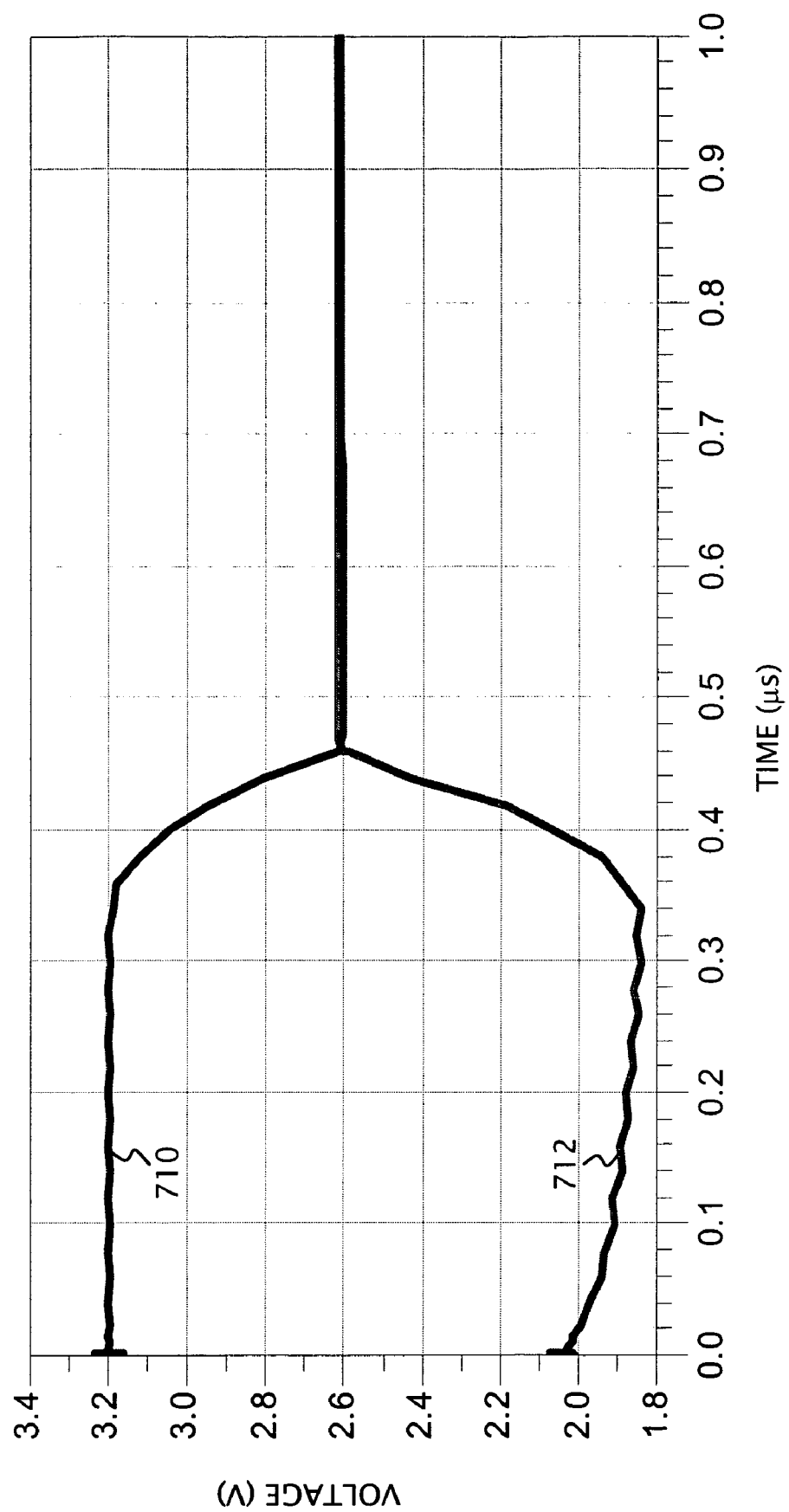
FIG. 7 is a graph illustrating how drain voltages of the enhancement-mode and depletion-mode transistors of the circuit embodiment illustrated in FIG. 5 are stabilized during operation of the exemplary circuit embodiment.

FIG. 7 is a graph 700 showing simulation results for the circuit 500 during the same time frames. In particular, graph 700 shows a plot 710 of the drain voltage of the E-mode transistor 510 and a plot 712 of the drain voltage of the D-mode transistor 512 during the same time period as FIG. 6. As can be seen from FIG. 7, circuit 500 reacts to the difference in the drain voltages and adjusts the gate voltages as necessary to substantially establish the reference voltage ($V_{ref}$). Thus, in this example, the currents and drain voltages can be equalized and the reference voltage at node 590 stabilized.

Simulations were also performed to evaluate the stability of the reference voltage ($V_{ref}$) produced by the circuit 500 over various temperatures. Table 1 below shows the results of the simulations:

TABLE 1

$V_{ref}$ at multiple different temperatures

| Temperature (° C.) | Reference Voltage (Volts) | $\Delta V_{ref}$ (%) |
|---|---|---|
| −20 | 2.575 | 0.049 |
| −10 | 2.571 | 0.176 |
| 0 | 2.572 | 0.151 |
| 10 | 2.573 | 0.128 |
| 20 | 2.591 | −0.577 |
| 30 | 2.575 | 0.043 |
| 40 | 2.571 | 0.204 |
| 50 | 2.571 | 0.204 |
| 60 | 2.573 | 0.096 |
| 70 | 2.590 | −0.564 |
| 80 | 2.580 | −0.154 |
| 90 | 2.570 | 0.245 |

The first column of Table 1 indicates the temperature at which the circuit 500 was operated, the second column lists the resulting reference voltage ($V_{ref}$) produced by the circuit embodiment, and third column lists the percentage difference from the average reference voltage ($\Delta V_{ref}$). As can be seen, for temperatures ranging from −20° C. to 90° C., the reference voltage produced is highly stable and exhibits less than 0.6% variation.

Simulations were also performed to evaluate the stability of the reference voltage ($V_{ref}$) in the circuit 500 assuming a variety of different voltages at the voltage source 540. Table 2 below shows the results of the simulation:

TABLE 2

$V_{ref}$ at multiple different source voltages

| Source Voltage (Volts) | Reference Voltage (Volts) | $\Delta V_{ref}$ (%) |
|---|---|---|
| 3.2 | 2.554 | 0.941 |
| 3.3 | 2.574 | 0.179 |
| 3.4 | 2.561 | 0.666 |
| 3.5 | 2.575 | 0.113 |
| 3.6 | 2.588 | −0.385 |
| 3.7 | 2.577 | 0.047 |
| 3.8 | 2.585 | −0.253 |
| 3.9 | 2.579 | −0.016 |
| 4 | 2.586 | −0.276 |
| 4.1 | 2.582 | −0.143 |
| 4.2 | 2.601 | −0.873 |

The first column of Table 2 indicates the supply voltage relative to ground for the circuit, the second column lists the resulting reference voltage ($V_{ref}$) produced by the circuit embodiment, and the third column lists the percentage difference from the average reference voltage ($\Delta V_{ref}$). Again, the reference voltage ($V_{ref}$) produced is highly stable and exhibits less than a 1% variation across this range of source voltages, which may represent voltages produced by a battery that can diminish over time.

Having illustrated and described the principles of the illustrated embodiments, it will be apparent to those skilled in the art that the embodiments can be modified in arrangement and detail without departing from such principles. For example, the described transistors whose gate-source voltages are used to provide the reference voltages need not be E-mode and D-mode transistors, but may comprise transistors having different threshold voltages. In certain particular implementations, for instance, two D-mode pHEMTs with different threshold voltages or two E-mode pHEMTs with different threshold voltages are used for the transistors.

Further, and as noted above, a variety of transistor technologies can be used to implement the disclosed embodiments. For example, a pair of HIGFETs can be used wherein one of the HIGFETs has a different threshold voltage than the other (for example, because of an implant in the source and/or drain region). Further, a pair of mHEMTs can be used wherein one of the mHEMTs has a different threshold voltage (for example, because of an amorphized region beneath a gate contact). Still further, a pair of inverted or non-inverted MOSFETs having different threshold voltages from one another can be used (for example, a D-mode and an E-mode MOSFET). A pair of MESFETs wherein one of the MESFETs has a different threshold voltage can similarly be used.

Further, the voltage difference on which the reference voltage is based may arise from a variety of physical differences between the transistors of the reference voltage circuit. For instance, one of the transistors may have a spatial dimension that differs from a corresponding dimension of the other transistor, thereby altering the electrical characteristics of the transistor such that the desired gate-source voltage difference is produced. For example, the lengths, widths, or heights of any of the layers forming the transistors, or the relative distances between any of the various components of the transistors, may differ. In certain implementations, for instance, the dimension of spatial extent that differs between the transistors is the separation between the gate contact surface and the channel. Other physical differences between the transistors can also be used to create the voltage difference. For example, in embodiments that utilize HEMTs, one of the HEMTs can have a different doping in its barrier and/or channel layer.

Moreover, depending on the implementation, the charge carrier in the transistors can be positive or negative, which may affect the polarity of the corresponding gate-source voltage. For instance, in certain embodiments, the applied gate-source voltages and the resulting reference voltage are negative. The source voltage can similarly be positive or negative depending on the implementation. Further, the voltages used to provide or define the reference voltage are not limited to the gate-source voltage, but can alternatively be another voltage associated with transistor operation. Further, although the described embodiments refer to circuits having a single E-mode transistor and a single D-mode transistor, other embodiments of the technology use multiple D-mode and E-mode transistors or combinations thereof.

In view of the many possible embodiments, it will be recognized that the illustrated embodiments include only examples and should not be taken as a limitation on the scope of the invention. Rather, the invention is defined by the following claims. I therefore claim as the invention all such embodiments that come within the scope of these claims.

What is claimed is:

1. A circuit, comprising:
   a depletion-mode transistor;
   an enhancement-mode transistor; and
   a circuit portion coupled to a gate region of the depletion-mode transistor and to a gate region of the enhancement-mode transistor and configured to provide a reference voltage at an output node, the reference voltage being associated with a difference between a first voltage at the gate region of the depletion-mode transistor and a second voltage at the gate region of the enhancement-mode transistor, and wherein the circuit portion is further configured to regulate the first voltage and the second voltage so that respective currents through the depletion-mode transistor and the enhancement-mode transistor are maintained in a substantially fixed relationship.

2. The circuit of claim 1, wherein the first voltage is a gate-source voltage of the depletion-mode transistor, and wherein the second voltage is a gate-source voltage of the enhancement-mode transistor.

3. The circuit of claim 1, wherein at least one of the depletion-mode transistor or the enhancement-mode transistor is a high electron mobility transistor (HEMT).

4. The circuit of claim 3, wherein at least one of the depletion-mode transistor or the enhancement-mode transistor is a pseudomorphic HEMT.

5. The circuit of claim 1, further comprising a current source coupled to respective parallel current paths through the depletion-mode transistor and the enhancement-mode transistor.

6. The circuit of claim 5, wherein the circuit portion further comprises an operational amplifier having a first input coupled to a first of the parallel current paths, a second input coupled to a second of the parallel current paths, and an output coupled to the gate region of the enhancement-mode transistor and to the gate region of the depletion-mode transistor, the output being coupled to the gate of the depletion-mode transistor through a resistive element.

7. The circuit of claim 1, wherein the circuit portion further comprises a temperature compensation circuit of one or more serially connected transistors.

8. The circuit of claim 1, wherein the depletion-mode transistor, the enhancement-mode transistor, and the circuit portion are defined on a common semiconductor substrate.

9. The circuit of claim 1, wherein the first transistor and the second transistor are transistors selected from the group consisting of high electron mobility transistors (HEMTs), metal-oxide-semiconductor FETs (MOSFETs), metal-semiconductor FETs (MESFETs), and heterojunction-insulated gate FETs (HIGFETs).

10. The circuit of claim 3, wherein the HEMTs are meta-morphic HEMTs (mHEMTs) or pseudomorphic HEMTs (pHEMTs).

11. A circuit, comprising:
    a first transistor and a second transistor configured to provide a reference voltage based at least in part on a difference between a spatial dimension of the first transistor and a corresponding spatial dimension of the second transistor, wherein the first transistor and the second transistor are field effect transistors (FETs), the first and the second transistors comprising respective channel layers in electrical communication with respective gate control surfaces, a separation between the channel layer and the gate control surface of the first transistor being different than a separation between the channel layer and the gate control surface of the second transistor; and
    a circuit portion coupled to both of the respective gate control surfaces of the first and second transistors and configured to produce an output voltage that is a function of the difference between gate voltages associated with the respective gate control surfaces, wherein the circuit portion further comprises a temperature compensation circuit configured to produce a current in the circuit portion that compensates for a current change in the first and/or second transistor associated with a temperature change.

12. A circuit, comprising:
    a first transistor and a second transistor configured to provide a reference voltage based at least in part on a difference between a spatial dimension of the first transistor and a corresponding spatial dimension of the second transistor, wherein the first transistor and the second transistor are field effect transistors (FETs), the first and the second transistors comprising respective channel layers in electrical communication with respective gate control surfaces, a separation between the channel layer and the gate control surface of the first transistor being different than a separation between the channel layer and the gate control surface of the second transistor; and
    a regulator circuit coupled to respective drains of the first and second transistors and to the respective gate control surfaces of the first and second transistors, the regulator circuit being responsive to changes in current through the first and second transistors and providing respective gate-source voltages to the gate control surfaces of the first and second transistors that stabilize the currents through the first and second transistors into a substantially fixed relationship.

13. The circuit of claim 12, wherein the first and the second transistors are high electron mobility transistors (HEMTs).

14. The circuit of claim 12, wherein the first transistor is a depletion-mode transistor and the second transistor is an enhancement-mode transistor.

15. The circuit of claim 12, wherein the first and second transistors are implemented on a common chip.

16. The circuit of claim 12 wherein the gate control surface of at least one of the first and second transistors is formed in an amorphized region beneath a respective gate contact.

17. The circuit of claim 12 further comprising a circuit portion coupled to both of the respective gate control surfaces of the first and second transistors and configured to produce an output voltage that is a function of the difference between gate voltages associated with the respective gate control surfaces.

18. The circuit of claim 17, wherein the circuit portion further comprises a temperature compensation circuit configured to produce a current in the circuit portion that compensates for a current change in the first and/or second transistor associated with a temperature change.

19. An electronic device, comprising:
a circuit configured to receive a reference voltage;
a reference-voltage circuit that generates the reference voltage, the reference-voltage circuit including an enhancement-mode high electron mobility transistor (HEMT) and a depletion-mode HEMT; and
wherein the reference-voltage circuit includes a regulator circuit portion configured to regulate the enhancement-mode HEMT and the depletion-mode HEMT so that currents through the respective HEMTs have a substantially fixed relationship.

20. The electronic device of claim 19, wherein the enhancement-mode HEMT and the depletion-mode HEMT are implemented on a common semiconductor substrate.

21. The electronic device of claim 19, wherein the enhancement-mode HEMT and the depletion-mode HEMT are pseudomorphic HEMTs (pHEMTs).

22. The electronic device of claim 19, wherein the reference voltage is based on a difference between a gate-source voltage of the enhancement-mode HEMT and a gate-source voltage of the depletion-mode HEMT.

23. The electronic device of claim 19, wherein the enhancement-mode HEMT includes a gate contact overlying a barrier layer, the barrier layer comprising an amorphized region beneath the gate contact.

* * * * *